US006242984B1

(12) United States Patent
Stones et al.

(10) Patent No.: US 6,242,984 B1
(45) **Date of Patent: *Jun. 5, 2001**

(54) MONOLITHIC 3D RADIAL POWER COMBINER AND SPLITTER

(75) Inventors: David I. Stones; Alfred E. Lee, both of Torrance, CA (US)

(73) Assignee: TRW Inc., Redondo Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/080,422

(22) Filed: May 18, 1998

(51) Int. Cl.[7] .............................. H03F 3/68; H01P 5/107; H01P 5/12

(52) U.S. Cl. .......................... 330/295; 333/125; 333/137; 333/26

(58) Field of Search .................................... 333/125, 137, 333/26; 330/295

(56) References Cited

U.S. PATENT DOCUMENTS 4,590,446 * 5/1986 Hsu et al. ............................ 333/125
4,598,254 * 7/1986 Saito et al. ........................ 333/125 X
4,700,145 * 10/1987 Yelland et al. .................. 333/125 X
4,812,782 * 3/1989 Ajioka .............................. 333/125 X
4,926,145 * 5/1990 Flam et al. ........................... 333/125
5,218,322 6/1993 Allison et al. ....................... 330/286
5,262,739 * 11/1993 Dalman .............................. 333/34 X

* cited by examiner

*Primary Examiner*—Benny Lee
(74) *Attorney, Agent, or Firm*—Michael S. Yatsko

(57) ABSTRACT

An SSPA module in accordance with the present invention comprises a signal input (102), and a radial splitter (100) connected to the signal input (102) comprising a plurality of radially extending splitter waveguides 104, 106, 108, 110, 112, 114, 116, 118, 120, 122, 124, 126. The SSPA module also includes a signal output (202), and a radial combiner (200) connected to the signal output (202) comprising a plurality of radially extending combiner waveguides 204, 206, 208, 210, 212, 214, 216, 218, 220, 222, 224, 226. Connections between the splitter (100) and combiner (200) are provided by a plurality of vertically extending waveguides 404, 406, 408, 410, 412, 414, 416, 418, 420, 422, 424, 426. The SSPA module also includes a plurality of processing circuits 304, 308, 308, 310, 312, 314, 316, 318, 320, 322, 324, 326, for example MMIC amplifiers, connected to the combiner waveguides 204, 206, 208, 210, 212, 214, 216, 218, 220, 222, 224, 226. A waveguide to microstrip transition (510) may also be used to connect signals propagating in the waveguides to and from microstrip lines connected to the processing circuitry (304–326). Generally, the transition (510) includes a waveguide section (512) with a top conducting layer (516) that defines a first slit (526) and a second slit (528) bounding a transition area (530) abutting a microstrip section (514) to form a waveguide to microstrip transition.

26 Claims, 4 Drawing Sheets

MONOLITHIC 3D RADIAL POWER COMBINER AND SPLITTER

BACKGROUND OF THE INVENTION

The present invention relates to solid state power amplifier modules. In particular, the invention relates to a solid state power amplifier module that splits a signal into multiple parts, uses distributed amplifiers to amplify the parts, and recombines the amplified parts into a single output.

Solid state power amplifier modules (SSPAs) have a variety of uses. For example, SSPAs may be used in satellites to amplify severely attenuated ground transmissions to a level suitable for processing in the satellite. SSPAs may also be used to perform the necessary amplification for signals transmitted to other satellites in a crosslink application, or to the earth for reception by ground based receivers.

Typical SSPAs achieve signal amplification levels of over 12 db. Because a single amplifier chip cannot achieve this level of power gain without introducing excessive noise into the signal and without incurring excessive size and power consumption, modern SSPA designs use a radial splitting and combining architecture in which the signal is divided into numerous individual parts. The individual parts are then individually amplified by an equal number of amplifiers. Finally, the outputs of the amplifiers are combined into a single output which achieves the desired overall signal amplification.

One difficulty faced by previous SSPA designs is that they do not work well at frequencies above a few gigahertz (GHz). Parasitic effects of interconnections, splitter and combiner structure, and the materials used to propagate the signal all contribute to the frequency limitations inherent with prior SSPAs. Interest continues to grow, however, in the communications industry on signals operating at frequencies much higher than a few GHz.

U.S. Pat. No. 5,218,322 to Allison et al. discloses a solid state microwave power amplifier module. Allison uses a first substrate formed of a low temperature co-fired ceramic material. The first substrate includes a radial power splitter that divides an input signal into a number of radially extending transmission lines placed in the substrate and terminating in respective output ends. Allison provides a second substrate including a number of solid state power amplifiers and transmission line circuitry for connecting the respective output ends to inputs of the solid state power amplifiers. The second substrate also includes a radial power combiner that combines the outputs of the solid state power amplifiers. The first substrate and the second substrate are joined such that the divider output signals are connected through vertical coaxial transmission lines to corresponding transmission lines in the combiner substrate.

In the Allison device, the radially extending transmission lines in the divider are created with stripline transmission lines (formed as a conductor between two ground planes and necessitating a multi-layer divider). Furthermore, at the edge of the divider, vertical coaxial transmission lines are created as metal filled vias surrounding a center conductor. The vertical coaxial transmission lines connect the radially extending transmission lines to the combiner. The combiner in Allison uses microstrip conductors coupled to the vertical coaxial transmission lines to connect the radial splitter transmission lines to the amplifier inputs on the combiner and to connect the amplifier outputs to the subsequent combiner structure.

The SSPA in Allison, however, is generally unsuitable for signals above a few GHz in frequency. Because the striplines, microstrips, and vertical coaxial structures all include parasitic effects (for example, self inductance), higher frequency signals tend to be severely attenuated when passing through the splitter and combiner structures. The parasitic effects are increased by the complicated multilayer interconnections required between the striplines, vertical coaxial transmission lines, and the microstrips.

In addition, previous SSPA designs tend to be bulky and heavy. The size and weight of the SSPA reduces the amount of other electronics a satellite can carry and provide power for, and increases the size and cost of the launch vehicle used put the satellite into orbit. Present SSPA designs, for example, include air dielectric waveguides with large flanges. The amplifier modules are separately built and later assembled with the splitter and combiner. The individual pieces of the SSPA require complex machining and, typically, include a large number of components that must be manually assembled. The resulting SSPA not only has excessive weight, but also has a high manufacturing cost and is generally limited to use at low frequency.

In part, interest in higher signal frequencies is a natural consequence of the lower frequency bands already operating at capacity to provide communications services. In addition, with fewer governmental restrictions being imposed on the availability of extremely high frequency bands (for example frequency bands extending over the 10–100 GHz range), those frequency bands are being turned to to provide bandwidth for additional communications services. An SSPA design able to operate at much higher frequencies is required to take advantage of the bandwidth available in the 10–100 GHz range.

Therefore a need is present in the industry for an improved high frequency SSPA module which overcomes the disadvantages discussed above and previously experienced.

BRIEF SUMMARY OF THE INVENTION

It is an object of the present invention to provide a solid state power amplifier (SSPA) module.

It is another object of the present invention to provide an SSPA module using a splitter and combiner structure.

It is yet another object of the present invention to provide an SSPA module that operates with extremely high frequency signals.

Still another object of the present invention is to provide an SSPA module using waveguides as a signal transfer medium between a splitter, amplifiers, and a combiner.

Yet another object of the present invention is to provide a waveguide to microstrip transition.

It is another object of the present invention to incorporate waveguide to microstrip transitions in the path between a splitter, amplifiers, and a combiner in an SSPA module.

An SSPA module in accordance with the present invention comprises a signal input on which a signal to be processed is presented, and a radial splitter connected to the signal input comprising a plurality of radially extending splitter waveguides connected to the radial splitter. The SSPA module also includes a signal output that provides a connection to the processed signal, and a radial combiner connected to the signal output comprising a plurality of radially extending combiner waveguides connected to the radial combiner. Connections between the radial splitter and radial combiner are provided by a plurality of vertically extending waveguides connected to the splitter waveguides and the combiner waveguides.

The SSPA module also includes a plurality of processing circuits connected to the combiner waveguides. For example, monolithic millimeter wave integrated circuits (MMICs) may be used to implement the processing circuitry, and in particular, the MMICs may operate as power amplifiers.

A waveguide to microstrip transition ("transition") may also be used in the SSPA module to connect signals propagating in the combiner waveguide to microstrip lines connected to the processing circuitry. Generally, the transition includes a microstrip section and a waveguide section. The waveguide section has a top conducting layer that defines a first slit and a second slit bounding a transition area on the top conducting layer. The transition area is abutted against the microstrip section to form the waveguide to microstrip transition. The transition may be used to connected signals travelling in the combiner waveguide to the processing circuitry as well as to connect an output of the processing circuitry to the combiner waveguide.

DETAILED DESCRIPTION OF THE INVENTION

Figure 1:
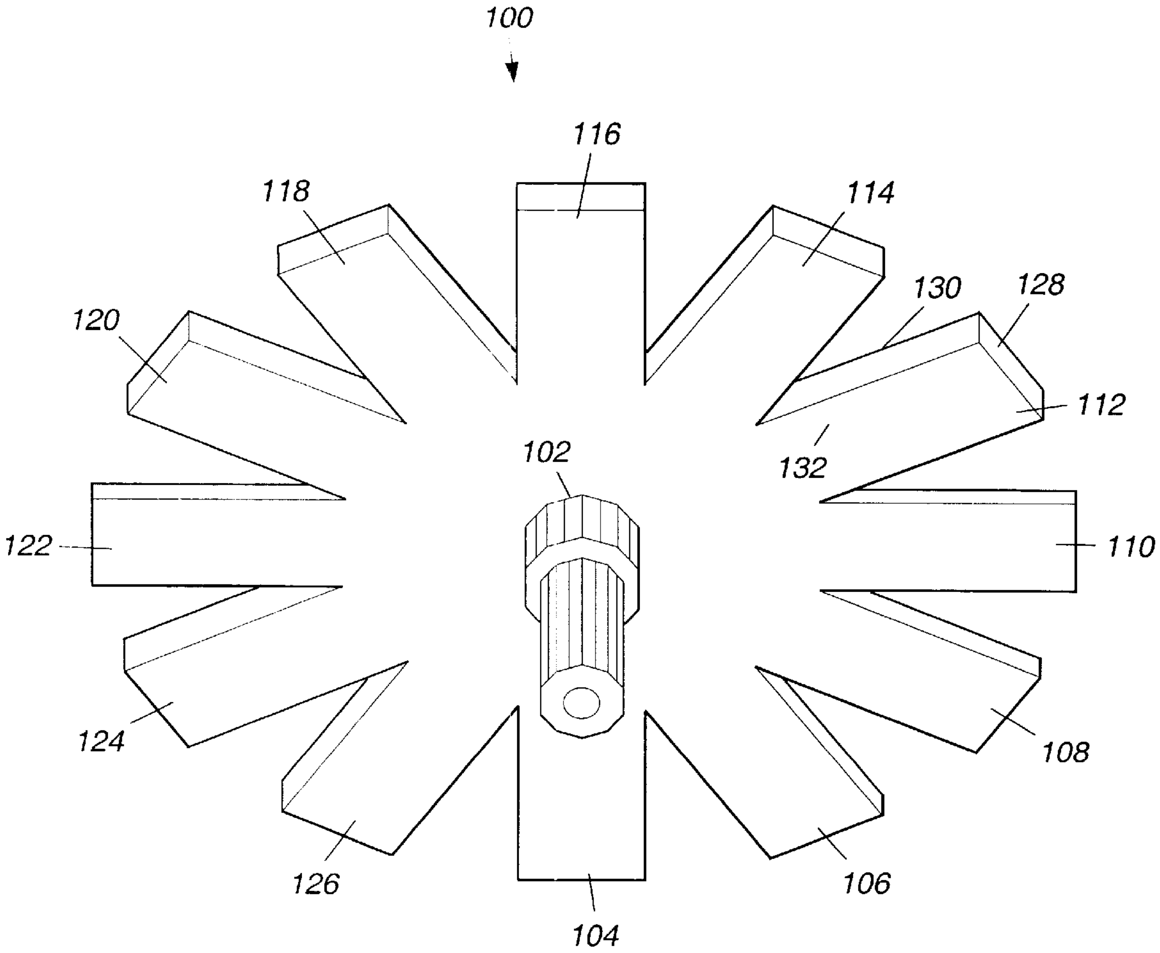
FIG. 1 shows a signal splitter and associated radially extending waveguides.

The SSPA module of the present invention generally includes a radial splitter, a radial combiner, and a plurality of processing circuits. Turning now to FIG. 1, a diagram of a radial splitter 100 is shown.

The radial splitter 100 includes a signal input 102 and a plurality of radially extending splitter waveguides 104, 106, 108, 110, 112, 114, 116, 118, 120, 122, 124, 126. Each of the splitter waveguides may be formed from a dielectric material 128 sandwiched between a lower metal surface 130 and an upper metal surface 132. A common lower metal surface may be formed for each of the splitter waveguides 104–126 from a single metal block which will be described in more detail below. Furthermore, the dielectric 128 generally fills the entire structure of the radial splitter 100.

The signal input 102 may be implemented as a coaxial input connection having an inner conductor and an outer conductor. The inner conductor (which carries the signal) of the coaxial input connection is driven through the dielectric 128 and connected to the lower metal surface 130. The outer conductor (typically grounded) is connected to the upper metal surface 132. As a result, the signal carried on the inner conductor of the coaxial input connection is coupled into the dielectric 128 and confined in the waveguides 104–126 by upper and lower metal surfaces (for example the upper metal surface 132 and the lower metal surface 130).

The dielectric 128 may be, for example, Aluminum Oxide (Alumina) or Beryllium Oxide (Beryllia). In a preferred embodiment, the dielectric 128 is a polymeric material, which is also inexpensive to manufacture in large quantities. The dielectric 128 is preferably approximately 6 mils thick. As noted above, a single block of metal may be used to form the lower metal surface 130 that contains the dielectric 128. The metal block may be constructed, for example, from a 2"×2" or 4"×4" block of Kovar® metal alloy and may be, for example, approximately 0.20" to 0.70" thick.

In one embodiment, the metal block may be machined to form slots approximately 6 mils deep and 87 mils wide. The slots may then be filled with the dielectric 128 and a metal coating may then be placed over the dielectric 128 to form the upper metal surface 132. The slots may be formed, for example, through milling, Electron Discharge Machining (EDM), or, preferably, laser discharge. The metal coating forming the upper metal surface 132 may be formed by an electroplating process using Copper or Aluminum. In order to avoid bubbles in the dielectric 128 (and therefore avoid discontinuities in the waveguide), the slots may be filled in a multi-step process under controlled conditions.

For example, two coatings of dielectric 128 (for example, polymide), each approximately 3 mils thick may be used in conjunction with 20 minutes of dwell time at 250–300 degrees C. In general, thinner coatings with diluted polymide solution result in fewer bubbles. In addition, lower viscosity of the polymide promotes the polymide wetting ability at corners and other areas with sharp angles to help avoid bubbles in those areas. Furthermore, baking the samples under vacuum effectively eliminates bubbles in the dielectric 128.

Because the dielectric 128 may produce an uneven surface when used to fill the slots, a planarization process may be used to smooth the dielectric 128 in preparation for the metal coating. Mechanical lapping is one suitable process for smoothing the dielectric 128 in the slots. For example, the dielectric 128 may be smoothed by mounting the metal base on a quartz plate, and wet lapping with a 400-grit cloth and subsequently lapping with finer grits down to a 9 mm size.

Figure 2:
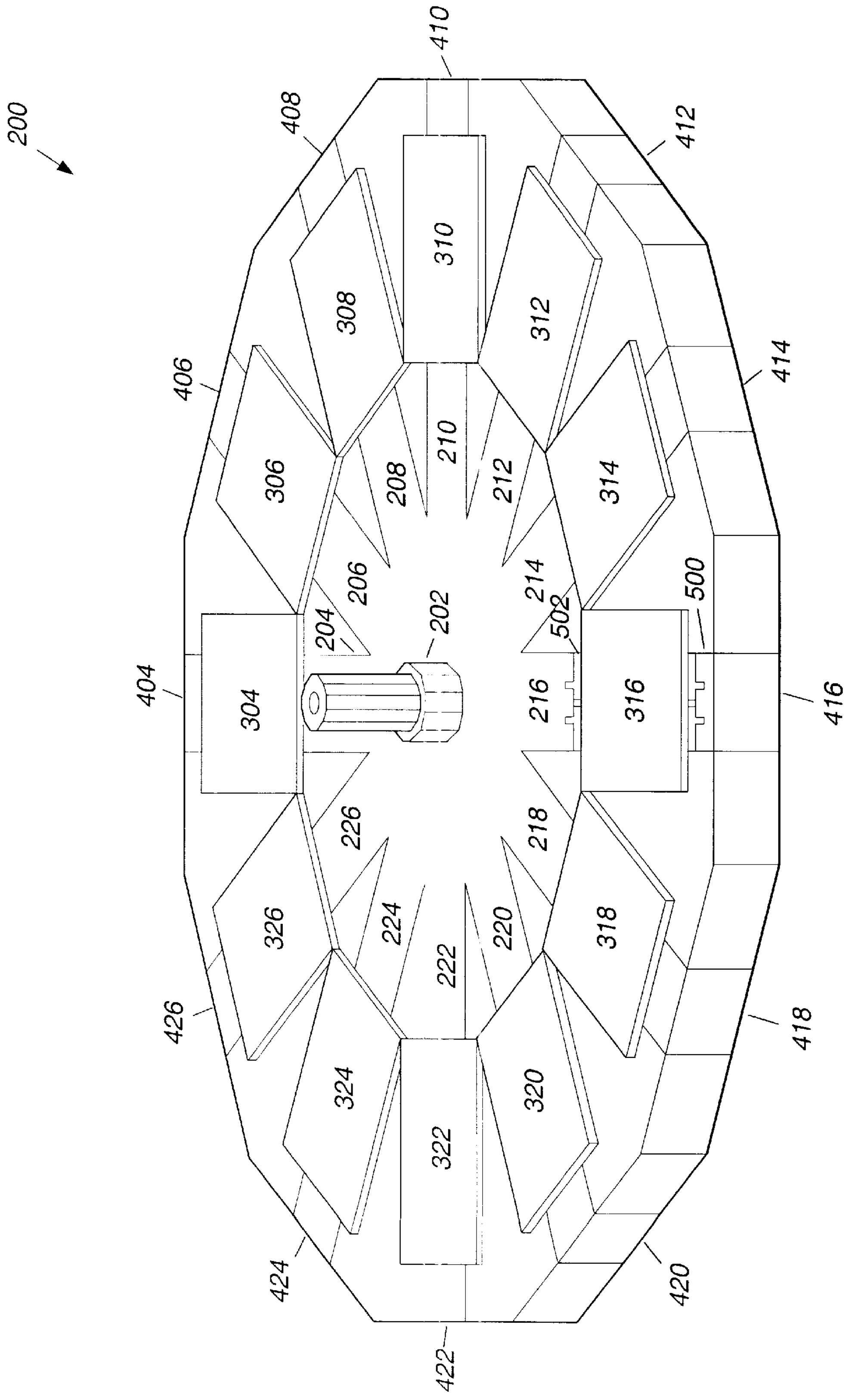
FIG. 2 shows a signal combiner, processing circuits, and associated radially extending waveguides.

Turning now to FIG. 2, a diagram showing a radial combiner 200 is presented. The radial combiner 200 includes a signal output 202, a plurality of radially extending combiner waveguides 204, 206, 208, 210, 212, 214, 216, 218, 220, 222, 224, 226, and a plurality of processing circuits 304, 306, 308, 310, 312, 314, 316, 318, 320, 322, 324, 326. Also included in the radial combiner 200 is a plurality of rectangular waveguides 404, 406, 408, 410, 412, 414, 416, 418, 420, 422, 424, 426, an input waveguide to microstrip transition 500 ("input transition"), and an output microstrip to waveguide transition 502 ("output transition").

The same metal block used to form the radial splitter 100 may be used to construct the radial combiner 200. In this fashion, the radial splitter 100 and the radial combiner 200 may be constructed back to back on the same metal block. In other words, the radial splitter 100 is preferably located on the opposite side of the block as the radial combiner 200. The splitter waveguides 104–126 may then be extended around to the radial combiner side of the block through, for example, a continuous channel comprising the rectangular waveguides 404–426 and the combiner waveguides 204–226. The combiner waveguides 204–226 may be formed in the same manner in the metal block as the splitter waveguides 104–126 and filled, preferably, with a polymeric material.

The rectangular waveguides 404–426 meet the splitter waveguides 104–126 and the waveguide to microstrip transitions (for example, transition 500) at the edge of the metal block.

Signal flow may then continue through the processing circuits 304–326, microstrip to waveguide transition (for example, transition 502), and combiner waveguides

204–226. The rectangular waveguides 404–426 may be formed in the same manner as noted above with respect to the splitter waveguides 104–126. The above structure thereby allows signals to flow in a continuous path through the signal input 102, waveguide structures 104–126, 204–226, 404–426, processing circuits 304–326, and signal output 202.

The signal output 202 may be implemented as a coaxial output connection having an inner conductor and an outer conductor. The inner conductor (which carries the signal) of the coaxial output connection is driven through the dielectric 128 and connected to a ground plane, typically the metal block. The outer conductor (typically grounded) is connected to the upper metal surface 132. As a result, the signals propagating inward on the combiner waveguides 204–226 of the radial combiner 200 are coupled to the inner conductor of the coaxial output connection.

As an example, the signal input 102 may accept a high frequency signal and connect the signal into the splitter waveguide structure as discussed above. As the signal propagates outward through the dielectric 128, portions of the signal pass through the splitter waveguides 104–126. The signal portion passing through the splitter waveguide 116 continues through the rectangular waveguide 416 and through the combiner waveguide 216. Each signal portion propagating inward from the combiner waveguides 204–226 meet and are coupled to the signal output 202. Before the signals pass though the combiner waveguides 204–226, the signals may be manipulated by the processing circuitry 304–326.

The processing circuits 304–326 act on the signals passing through them. In an SSPA, for example, each of the processing circuits 304–326 may be a MMIC amplifier. Each individual MMIC amplifier may then amplify the signal portion passing through it to achieve a total amplification (when combined at the signal output 202) impracticable through the use of a single MMIC amplifier. Other types processing circuits 304–326 may also be used, including for example, filters and phase shifters. Electrical connections to the processing circuits 304–326 may be made through the input transition 500 and the output transition 502.

Figure 3:
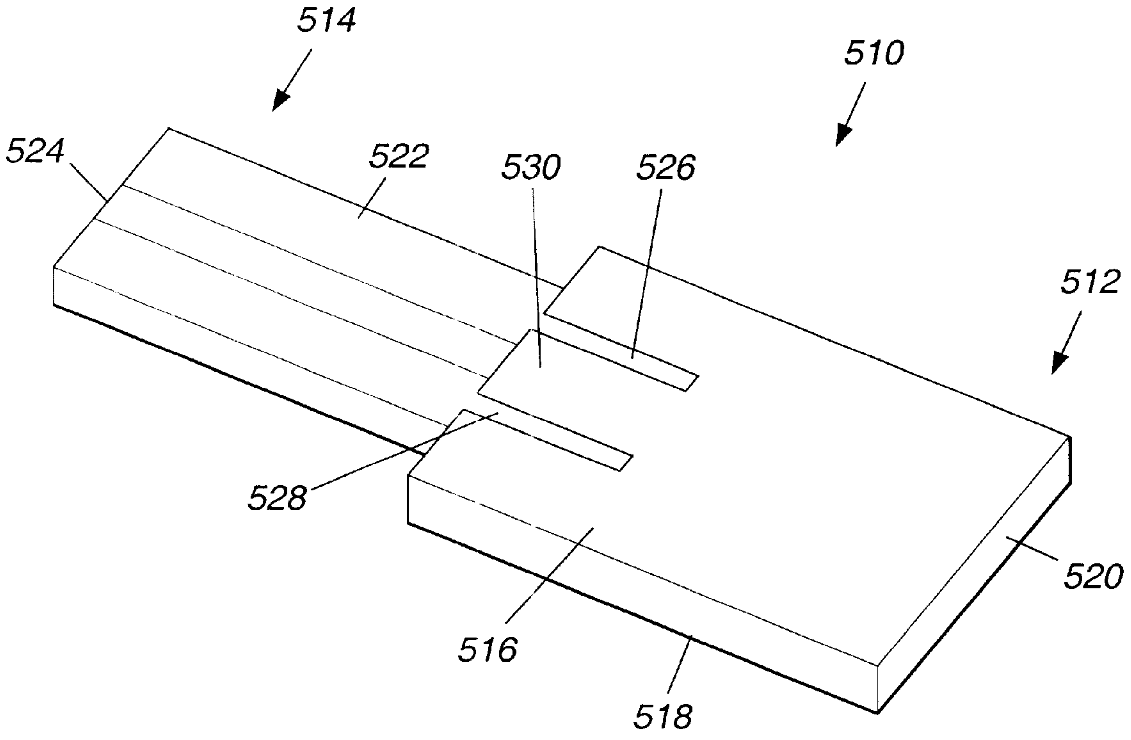
FIG. 3 illustrates one example of a waveguide to microstrip transition suitable for use with the present invention.

Turning now to FIG. 3, a diagram of a transition 510 that may be used for both the input transition 500 and the output transition 502 of FIG. 2 is shown. The transition 510 includes a waveguide section 512 and a microstrip section 514. The waveguide section 512 may, for example, be formed near the processing circuits 304–326 and the rectangular waveguides 404-426.

The waveguide section 512 is generally constructed as an upper metal surface 516 and a lower metal surface 518 between which a dielectric 520, preferably a polymeric material, is placed. In the microstrip section 514, a dielectric 522 (which need not match the dielectric 520) may also be used to support a microstrip 524. Although the dielectric 522 as shown in FIG. 3 is narrower than the dielectric 520, the dielectric 522 may be the same width as or wider than the dielectric 520.

The microstrip section 522 is abutted against the waveguide section 512. As a result, the microstrip 524 makes electrical contact with the top metal layer 516. In order to efficiently couple the signal traveling in the waveguide section 512 to the microstrip 524, a first slit 526 and a second slit 528 are formed in the upper metal layer 516. In one embodiment of the present invention, the first slit 526 and the second slit 528 are separated by approximately 32 mils and are each approximately 23 mils long.

In general, the separation between the first slit 526 and the second slit 528 may be varied over a wide range to provide a transition area 530 that couples to the microstrip 524. Preferably, the width of the transition area 530 is selected such that the transition area impedance matches the microstrip impedance. The length of the first slit 526 and the second slit 528 are generally set at one quarter of the wavelength of the signal travelling in the waveguide section 512. As a result, the signal is forced between the first slit 526 and the second slit 528 into the transition area 530, thereby enhancing the amount of signal coupled to the microstrip 524.

Once the signal traveling in the waveguide section 512 has transitioned to the microstrip 524, the signal may travel freely through the microstrip 524. In particular, the microstrip 524 is typically connected to a bonding pad or other input pin of one of the processing circuits 304–326. The processing circuit may then manipulate the signal and produce an output on another microstrip line subsequently coupled to a combiner waveguide 204–226 through another transition 510.

Figure 4:
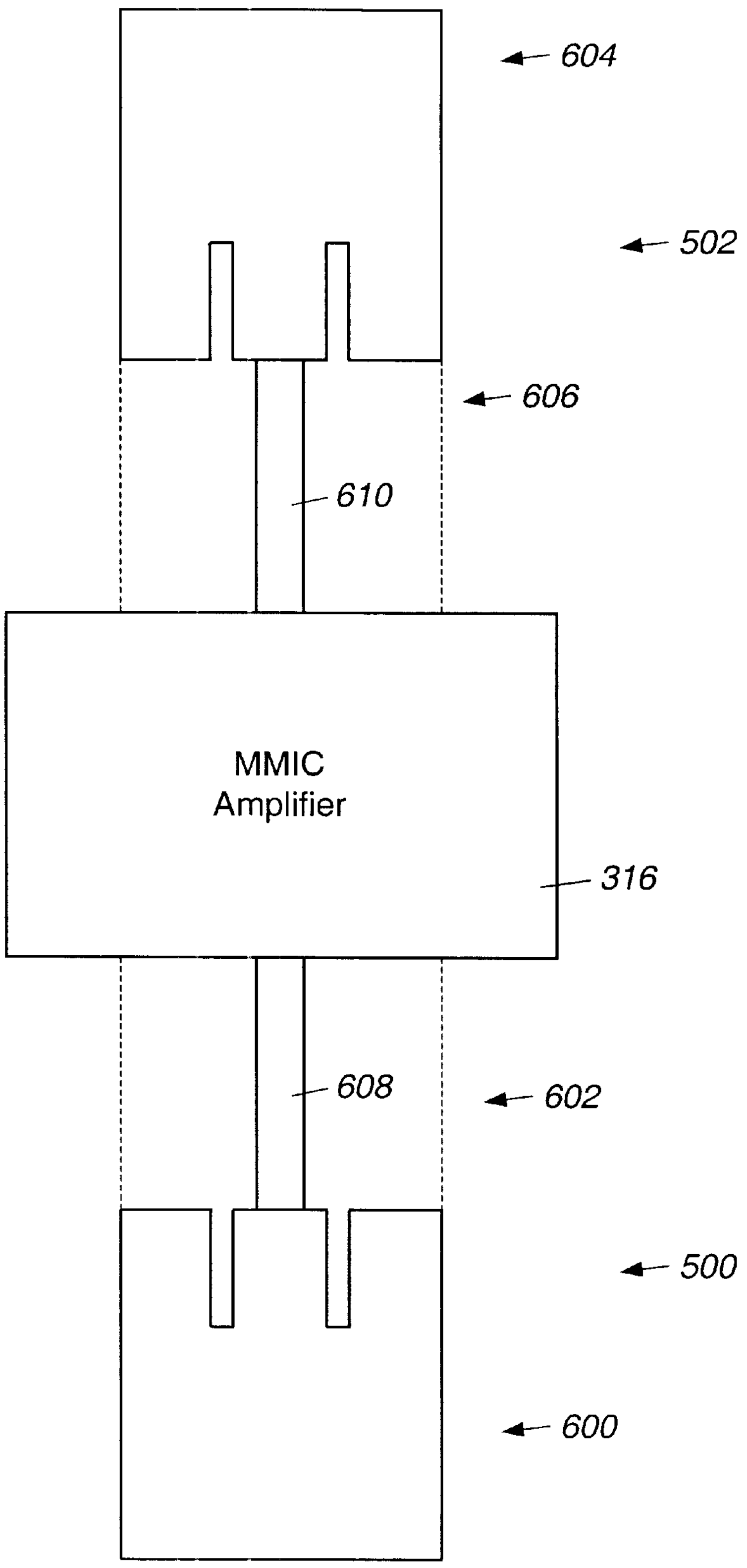
FIG. 4 shows an example of waveguide to microstrip transitions connecting to an input and an output of a MMIC chip to waveguides.

For example, FIG. 4 shows the input transition 500 and the output transition 502 of FIG. 2 connected to the processing circuit 316, in this case a MMIC amplifier. As an example, the input transition 500 may be formed as part of a first portion of the waveguide adjacent to the rectangular waveguide 416 (as shown in FIG. 2). The processing circuit 316 may then produce an output connected to the output transition 502 formed (as shown in FIG. 2) from a portion of the combiner waveguide 216 adjacent to the signal output 202.

As depicted in FIG. 4 and described above with reference to the transition 510 in FIG. 3, the input transition 500 includes a waveguide section 600 and a microstrip section 602. Similarly, the output transition 502 includes a waveguide section 604 and a microstrip section 606. The signal in the waveguide section 600 travels through the waveguide section 600 to the microstrip section 602 where it is coupled onto the microstrip 608.

The microstrip 608 connects the signal to the processing circuit 316 in which the signal is manipulated, for example, amplified, and output on the microstrip 610 of the microstrip section 606. The manipulated signal travels through the microstrip 610 until it reaches the waveguide section 604. At the waveguide section 604, the signal on the microstrip 610 transitions into the waveguide section 604 and continues along the associated combiner waveguide until it reaches the signal output 202. At the signal output 202, signals which traveled down other combiner waveguides combine to form a single output.

Both the input transition 500 and the output transition 502 may be constructed as noted above with reference to the transition 510. Furthermore, each processing circuit 304–326 typically includes an input transition and an output transition to connect to the signals travelling in the combiner waveguides 204–226. One complete path, for example, through the SSPA module of the present invention thereby comprises the signal input 102, the splitter waveguide 104, the rectangular waveguide 404, the input transition 502, the processing circuit 316, the output transition 504, the combiner waveguide 204, and the signal output 202.

While particular elements, embodiments and applications of the present invention have been shown and described, it is understood that the invention is not limited thereto since modifications may be made by those skilled in the art, particularly in light of the foregoing instruction. It is therefore contemplated by the appended claims to cover such modifications and incorporate those features which come within the spirit and scope of the invention.

What is claimed is:

1. A solid state signal processing module comprising:

a signal input;

a radial splitter connected to said signal input, said radial splitter comprising a plurality of radially extending splitter waveguides, each splitter waveguide having a splitter bottom metal surface fashioned into a first side of a block of metal and connected to said signal input;

a signal output;

a radial combiner connected to said signal output, said radial combiner comprising a plurality of radially extending combiner waveguides, each combiner waveguide having a combiner bottom metal surface fashioned into a second side of said block of metal opposite said first side and connected to said signal output; and a plurality of vertically extending waveguides exteriorly formed into edges of said block of metal to individually continue each of said radially extending splitter waveguides to meet a predetermined one of said radially extending combiner waveguides, thereby providing a plurality of continuous channels from said signal input to said signal output through said splitter waveguides, said vertically extending waveguides, and said combiner waveguides.

2. The solid state signal processing module of claim 1, further comprising a processing circuit coupled into a selected combiner waveguide of said plurality of combiner waveguides, said selected combiner waveguide coupled to a predetermined one of said plurality of vertically extending waveguides.

3. The solid state signal processing module of claim 2, wherein said processing circuit comprises a MMIC processing circuit.

4. The solid state signal processing module of claim 3, wherein said MMIC processing circuit is a power amplifier.

5. The solid state signal processing module of claim 2, further comprising an input transition connected to said processing circuit and provided in said selected combiner waveguide.

6. The solid state signal processing module of claim 5, further comprising an output transition connected to said processing circuit and provided in said selected combiner waveguide.

7. The solid state signal processing module of claim 6, wherein said signal output transition comprises:

a microstrip section comprising a microstrip supported by a dielectric; and a waveguide section coupled to said selected combiner waveguide, said waveguide section having a top conducting layer, said top conducting layer defining a first slit and a second slit, said first slit and said second slit bounding a transition area of said top conducting layer, said transition area abutting said microstrip.

8. The solid state signal processing module of claim 7, wherein said transition area has a width that matches an impedance of said transition area to an impedance of said microstrip section.

9. The solid state signal processing module of claim 6, wherein said block of metal comprises a metal alloy.

10. The solid state signal processing module of claim 9, wherein at least one of said combiner waveguides is filled with a polymeric material.

11. The solid state signal processing module of claim 9, wherein at least one of said splitter waveguides is filled with a polymeric material.

12. The solid state signal processing module of claim 6, wherein said input transition comprises:

a microstrip section comprising a microstrip supported by a dielectric; and a waveguide section coupled to said predetermined one of said plurality of vertically extending waveguides, said waveguide section having a top conducting layer, said top conducting layer defining a first slit and a second slit, said first slit and said second slit bounding a transition area of said top conducting layer, said transition area abutting said microstrip.

13. The solid state signal processing module of claim 12, wherein said transition area has a width that matches an impedance of said transition area to an impedance of said microstrip section.

14. The solid state signal processing module of claim 1, wherein said signal input comprises a coaxial input connection.

15. The solid state signal processing module of claim 1, wherein said signal output comprises a coaxial output connection.

16. A waveguide to microstrip transition comprising:

a microstrip section comprising a microstrip supported by a dielectric; and a waveguide section having a top conducting layer, said top conducting layer defining a first slit and a second slit, said first slit and said second slit bounding a transition area of said top conducting layer, said transition area abutting said microstrip.

17. The waveguide to microstrip transition of claim 16, wherein said first slit and said second slit have a length approximately equal to one quarter of a wavelength of a signal travelling in said waveguide section.

18. The waveguide to microstrip transition of claim 17, wherein said transition area has a width that matches an impedance of the transition area to an impedance of the microstrip section.

19. A signal splitter/combiner comprising:

a signal connection;

signal waveguides coupled to said signal connection;

a signal input transition provided in a selected signal waveguide of said signal waveguides, said signal input transition comprising:

a first microstrip section comprising a first dielectric supported microstrip; and a first waveguide section having a first top conducting layer, said first top conducting layer defining a first slit and a second slit, said first slit and said second slit bounding a first transition area of said first top conducting layer, said first transition area abutting said first dielectric supported microstrip.

20. The splitter/combiner of claim 19, wherein said first transition area has a first width that matches a first transition area impedance to a first microstrip section impedance.

21. The signal splitter/combiner of claim 19, further comprising a signal output transition provided in said selected signal waveguide, said signal output transition comprising:

a second microstrip section comprising a second dielectric supported microstrip; and a second waveguide section having a second top conducting layer, said second top conducting layer defining a third slit and a fourth slit, said third slit and said fourth slit bounding a second transition area of said second top conducting layer, said second transition area abutting said second dielectric supported microstrip.

22. The signal splitter/combiner of claim 21, further comprising a processing circuit coupled to said signal input transition and to said signal output transition.

23. The splitter/combiner of claim 21, wherein said second transition area has a second width that matches a second transition area impedance to a second microstrip section impedance.

24. The signal splitter/combiner of claim 19, wherein said signal waveguides extend radially outward from said signal connection.

25. The signal splitter/combiner of claim 19, wherein said signal waveguides each have a bottom metal surface fashioned in a first side of a block of metal.

26. The signal splitter/combiner of claim 25, further comprising a vertically extending waveguide coupling a signal waveguide in said first side of said block of metal to a waveguide in a second side of said block of metal.

* * * * *